United States Patent
Willis et al.

(10) Patent No.: US 7,684,191 B1
(45) Date of Patent: Mar. 23, 2010

(54) SELF-RETAINING VIBRATION ISOLATING FAN MOUNT ASSEMBLY

(75) Inventors: Clifford B. Willis, Tracy, CA (US); William A. De Meulenaere, Newark, CA (US); Brett C. Ong, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/199,916

(22) Filed: Aug. 28, 2008

(51) Int. Cl.
*H05K 7/20* (2006.01)
(52) U.S. Cl. .................. 361/695; 361/694; 454/184
(58) Field of Classification Search ......... 361/694–695; 454/184
See application file for complete search history.

(56) References Cited

U.S. PATENT DOCUMENTS

| | | | | |
|---|---|---|---|---|
| 5,677,829 A | * | 10/1997 | Clemens | 361/697 |
| 5,788,566 A | * | 8/1998 | McAnally et al. | 454/184 |
| 6,017,185 A | * | 1/2000 | Kuo | 415/177 |
| 6,351,380 B1 | * | 2/2002 | Curlee et al. | 361/695 |
| 6,549,406 B1 | * | 4/2003 | Olesiewicz et al. | 361/695 |
| 6,894,897 B1 | * | 5/2005 | Nagurny et al. | 361/695 |
| 7,004,236 B2 | * | 2/2006 | Lee et al. | 165/80.3 |
| 7,145,771 B2 | * | 12/2006 | Wang | 361/695 |
| 7,494,408 B2 | * | 2/2009 | Chen et al. | 454/184 |
| 2004/0184234 A1 | * | 9/2004 | Kosugi | 361/695 |
| 2004/0240175 A1 | | 12/2004 | Brovald et al. | |
| 2006/0133035 A1 | * | 6/2006 | Ku et al. | 361/695 |
| 2007/0133169 A1 | * | 6/2007 | Lin | 361/695 |
| 2007/0242433 A1 | * | 10/2007 | Lin et al. | 361/697 |

OTHER PUBLICATIONS http://web.archive.org/web/20041030114955/http://www.earsc.com/HOME/products/Damp, "Isolation Materials", 2 pages, Publication date Oct. 30, 2004.

* cited by examiner

*Primary Examiner*—Gregory D Thompson
(74) *Attorney, Agent, or Firm*—Brooks Kushman P.C.

(57) ABSTRACT

A fan assembly for an electronic device is provided. The assembly comprises a fan housing, at least one bracket member, and at least one retention peg. The fan housing defines a recess therein for directing heat away from a electrical components positioned within the electronic device. The bracket member supports the fan housing within the electronic device. The retention peg is disposed about the bracket member and includes a plurality of ribs for insertion into the recess to retain the bracket member to the fan housing.

20 Claims, 5 Drawing Sheets

SELF-RETAINING VIBRATION ISOLATING FAN MOUNT ASSEMBLY

BACKGROUND

1. Technical Field

One or more embodiments of the present invention described herein generally relate to a self-retaining vibration isolation fan mount assembly.

2. Background Art

It is generally known that various electrical/electronic components on a circuit board are capable of generating large amounts of heat. To minimize exposure to such heat, a plurality of fans are disposed proximate to the electrical/electronic components for blowing the heat away from the components thereby increasing the life span of such components and ensuring operational integrity of the computer. In general, at least one fan is typically coupled to and supported by at least one fan bracket. The fan bracket is generally coupled to a computer chassis of a computer.

The manner in which the fans are coupled to the fan brackets are gaining attention as the amount of vibration caused by the fans while positioned on the fan brackets may affect the performance of surrounding components positioned within the computer. For example, hard disk drives (HDDs) are sensitive to such vibrations. HDD operation may be degraded if exposed to the vibrations. Conventional fan brackets generally include isolation mounting pegs that are coupled to the fans to absorb vibrations generated by the fan. The isolation mounting pegs may be made of a material that is different than the material used to construct the fan bracket to absorb the vibration. While the isolation mounting pegs are generally useful, such isolation mounting pegs may provide for a loose fitting between recesses of the fans which generally receive the pegs. As such, the fans move over the pegs to and from the fan bracket over time causing the fan bracket to deform over time.

SUMMARY

In at least one embodiment, a fan assembly for a computer is provided. The fan assembly comprises a fan housing, at least one bracket member, and at least one retention peg. The fan housing defines at least one recess therein and is configured to direct heat away from a plurality of electrical components positioned within the computer. The bracket member supports the fan housing within the computer. The retention peg is disposed about the bracket and includes a plurality of ribs spaced apart from one another for insertion into the recess to retain the bracket to the fan.

In another embodiment, a system for cooling a plurality of computer components is provided. The system comprises a computer chassis, a fan housing, at least one bracket member, and at least one retention peg. The fan housing defines at least one recess therein and is configured to cool the plurality of computer components. The bracket member supports the fan housing on the computer chassis. The retention peg is disposed about the bracket member and includes a plurality of ribs spaced apart from one another for insertion into the recess to retain the bracket to the fan.

In another embodiment, a fan assembly for an electronic device is provided. The fan assembly includes a fan housing, at least one bracket member, and at least one retention peg. The fan housing defines at least one recess therein and is configured to direct heat away from a plurality of electrical components positioned within the electronic device. The bracket member supports the fan housing within the electronic device. The retention peg is disposed about the bracket member and includes at least one rib for insertion into the recess to retain the bracket member to the fan housing. The material of the retention peg and the ribs are different from the material of the bracket member.

BRIEF DESCRIPTION OF THE DRAWINGS

The embodiments of the present invention are pointed out with particularity in the appended claims. However, other features of the various embodiments will become more apparent and will be best understood by referring to the following detailed description in conjunction with the accompany drawings in which:

DETAILED DESCRIPTION

Detailed embodiments of the present invention are disclosed herein. However, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

Figure 1:
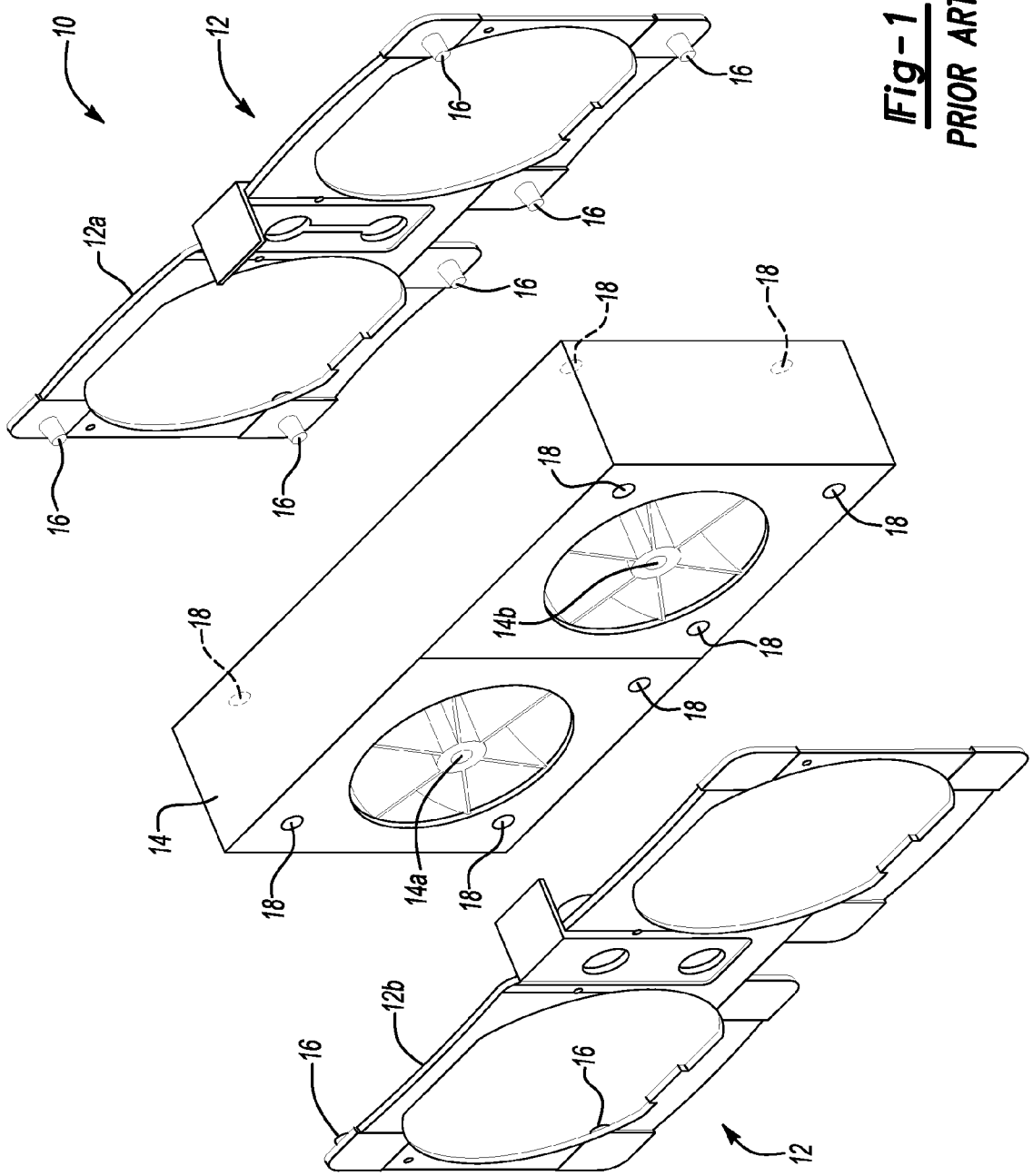
FIG. 1 depicts a first perspective view of a prior art fan assembly.

Referring now to FIG. 1, a perspective view of a prior art fan assembly 10 is shown. The assembly 10 includes a fan bracket assembly 12 that is capable of being mounted to a computer chassis (not shown) of a computer. The fan bracket assembly 12 supports a fan housing 14. The fan housing 14 includes first and second fans 14a-14b and is positioned on the computer chassis for moving heat away from a plurality of electronics (not shown). The fan bracket assembly 12 generally includes first and second bracket members 12a and 12b. Each bracket member 12a and 12b includes a plurality of isolation pegs 16. Each fan 14a and 14b includes a plurality of recesses 18 for receiving the isolation pegs 16 so that the first and the second bracket members 12a and 12b retain the fans 14a and 14b therebetween.

The isolation pegs 16 are generally cylindrical in shape. The isolation pegs 16 are generally constructed from a different set of materials from that of the first and the second bracket members 12a and 12b. In one example, the isolation pegs 16 may each be constructed of an elastomer and the first and the second bracket members 12a and 12b may be constructed of plastic. The recesses 18 of the fans 14a and 14b are generally configured to facilitate a loose fit with the isolation pegs 16 to allow the fans 14a and 14b to move about the isolation pegs 16. If the recesses 18 are arranged such that a tight interference fit is created with the pegs 16, the first and second bracket members 12a and 12b may act as a conductor and transmit vibrations through the computer chassis and onto to other such electrical components positioned proximate to the fan assembly 10 while the fans 14a and 14b rotate.

In this type of arrangement, any such HDD (or other suitable device capable of having its operation interfered with due to vibration) positioned proximate to the first and second bracket members 12a and 12b may be exposed to the vibrations caused by the fans 14a and 14b. Such vibrations may affect the performance of the HDD. While the loose fitting characteristic with respect to the isolation pegs 16 and the recesses 18 minimize the transmission of vibrations from the fans 14a and 14b to the HDD, the loose fitting characteristic may deform the fan bracket 12 as will be described in more detail in connection with FIGS. 2A-2B.

Figure 2A:
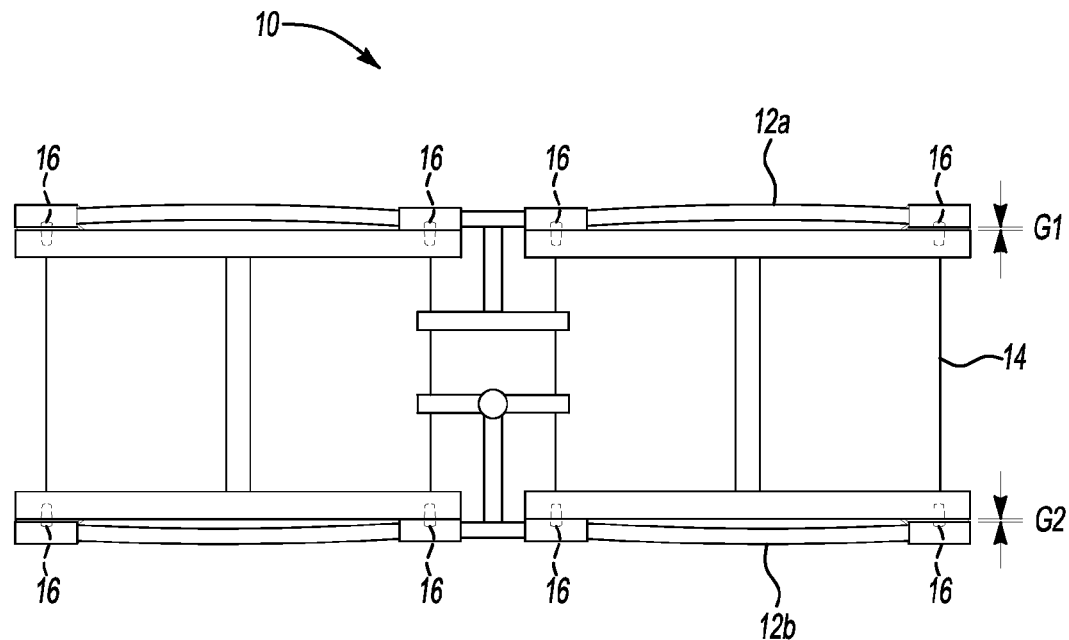
FIG. 2A depicts a first top view of the prior art fan assembly.
Figure 2B:
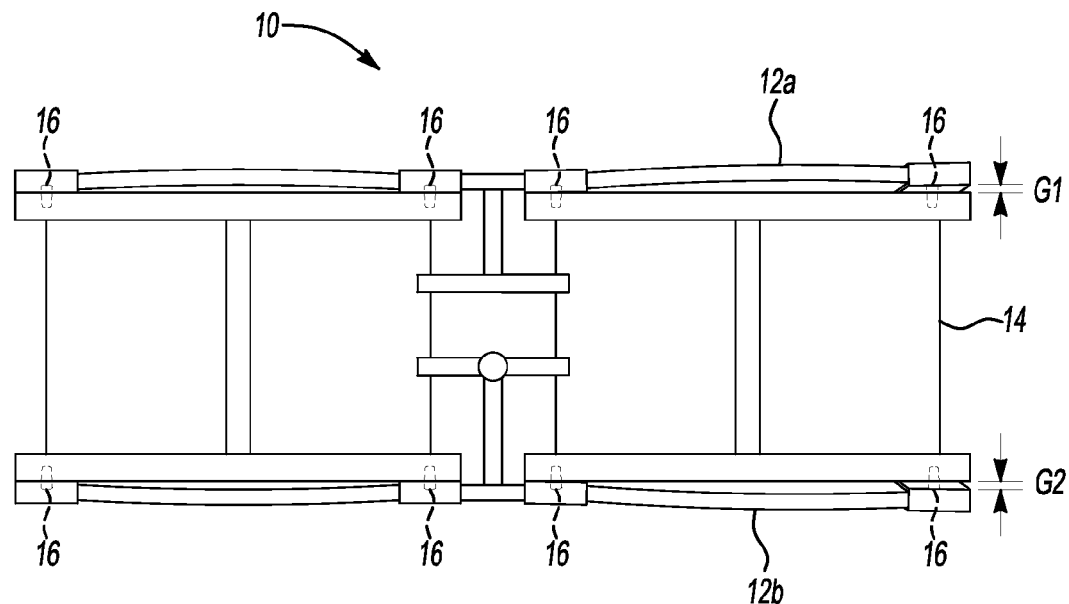
FIG. 2B depicts a second view of the prior art fan assembly.

Referring now to FIGS. 2A-2B, top views of the prior art fan assembly 10 are shown. FIG. 2A illustrates the presence of a first gap G1 that is formed between the first bracket member 12a and the fan housing 14. A second gap G2 is also formed between the second bracket member 12b and the fan housing 14. Each gap G1 and G2 is generally uncontrolled which means that the fans 14a and 14b are free to move within the gaps G1 and G2 when the fans rotate.

FIG. 2B depicts the condition whereby the first and the second bracket members 12a and 12b have buckled outward due to the movement of the fans 14a and 14b within the fan housing 14 on the plurality of isolation pegs 16 (e.g., see gap increase between G1 and G2 for FIGS. 2A and 2B). The deformation of the bracket members 12a and 12b may become more pronounced over time. The deformation may be accelerated due to temperature cycling. For example, the fan assembly 10 while in the computer may be exposed to 70 C for long periods of time (e.g., up to 22 hours).

The deformation of the bracket members 12a and 12b may provide the situation whereby less surface area within one or more of the recesses 18 of the fans 14a-14b (e.g, apertures in the fan 12a and 12b that receive the isolation pegs 16) are capable of contacting the vibrating isolation properties of the pegs 16 thereby minimizing the benefits of implementing the various isolation properties of the pegs 16. Further, over time, the fans 14a and 14b may altogether disengage from one or more of the pegs 16 due to the buckling of the first and the second brackets members 12a and 12b as shown in FIG. 2B.

Figure 3:
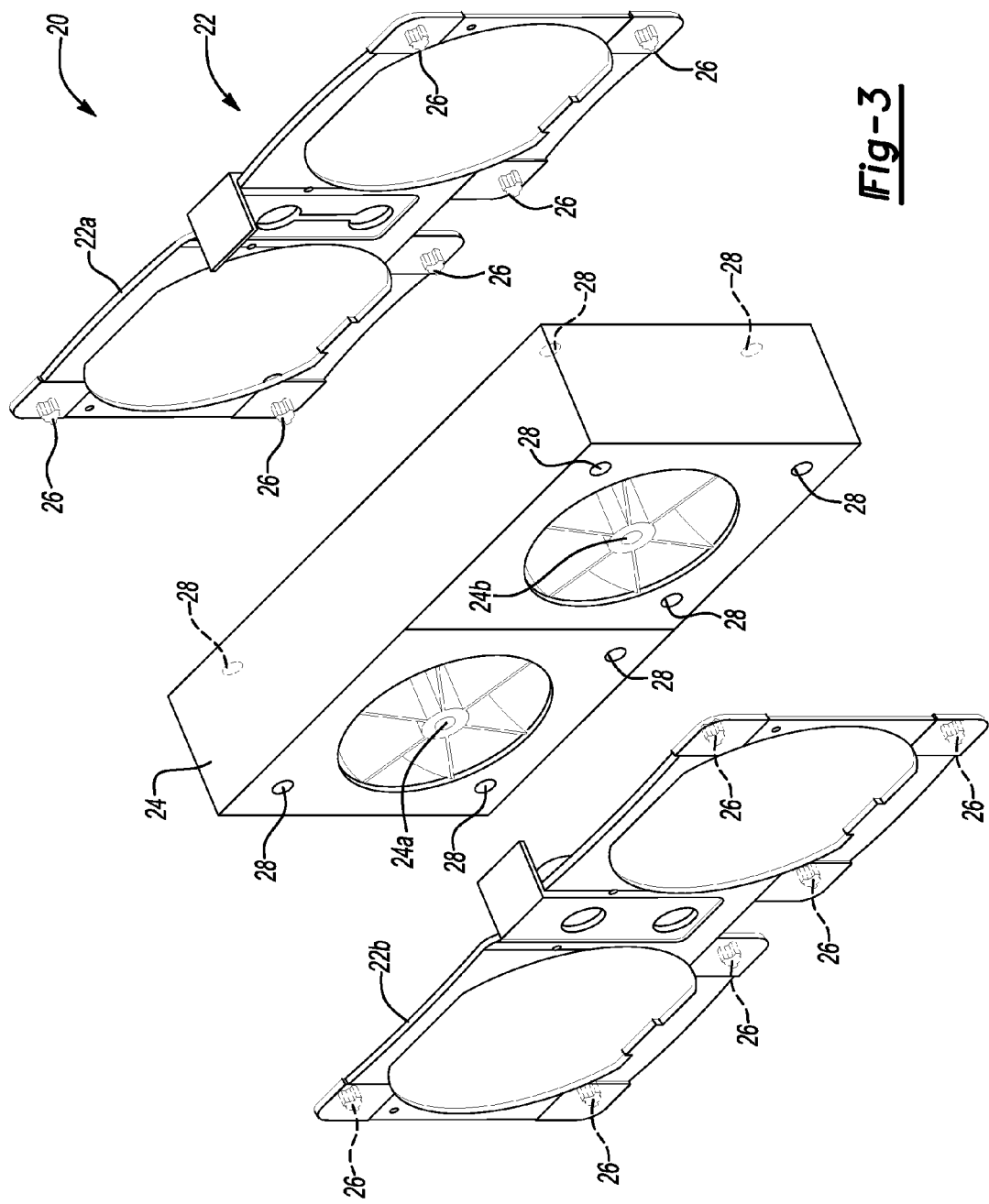
FIG. 3 depicts a perspective view of a fan assembly in accordance to one embodiment of the present invention

Referring now to FIG. 3, a perspective view of a fan assembly 20 in accordance to one embodiment of the present invention is shown. The assembly 20 includes a fan bracket assembly 22 that is capable of being mounted to a computer chassis of a computer. It is generally contemplated that the fan assembly 20 may be used or implemented for any type of electrical device that includes electrical components capable of generating heat and is not to be limited for use solely to computer applications. The fan bracket assembly 22 supports a fan housing 24. The fan housing 24 includes first and second fans 24a-24b and is positioned on the computer chassis for moving heat away from a plurality of electronics (not shown). While FIG. 3 depicts two fans, it is generally contemplated that the fan assembly 24 may include any number of fans. The number of fans implemented within the fan housing 24 may vary based on the desired criteria of a particular implementation. The fan bracket assembly 22 generally includes first and second bracket members 22a and 22b. Each bracket member 22a and 22b includes a plurality of retention pegs 26. The fan housing 27 includes a plurality of recesses 28 for receiving the retention pegs 26 so that the first and the second bracket members 22a and 22b retain the fans 24a and 24b therebetween.

Figure 4:
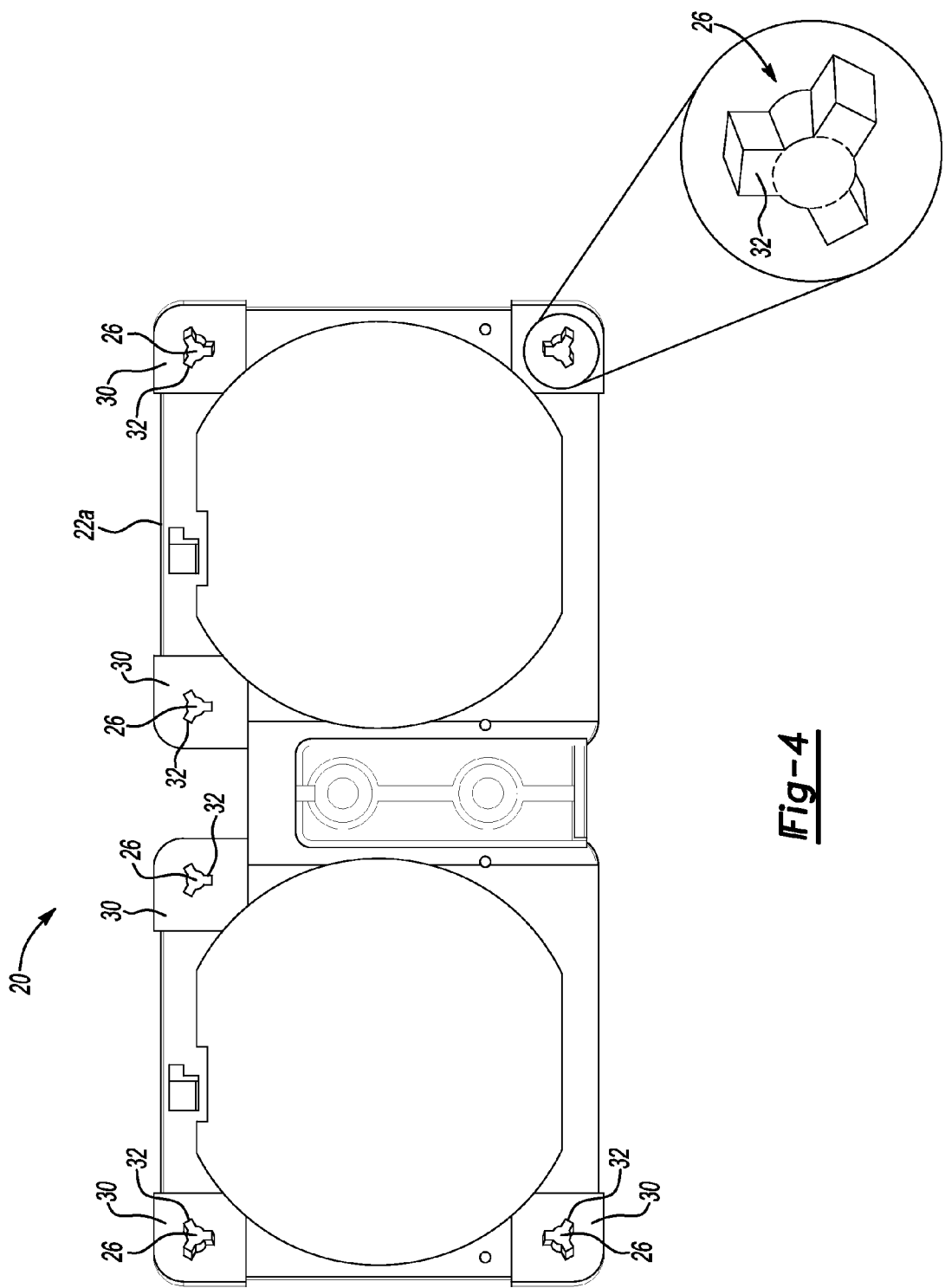
FIG. 4 depicts a first bracket member of the fan assembly of FIG. 3 in accordance to one embodiment of the present invention.

Referring now to FIG. 4, the first bracket member 22a of the fan assembly 20 in accordance to one embodiment of the present invention is shown. Each retention peg 26 is integrally formed with a base 30. In one example, each peg 26 and base 30 may be molded together to form a single piece (or integrated piece). It is generally contemplated that the pegs 26 and the bases 30 are formed of a thermoplastic elastomer or other suitable vibration isolation material. The pegs 26 and the bases 30 are positioned over predesignated sections of the first bracket member 22a. The particular placement of the pegs 26 and the bases 30 on the first and the second bracket members 22a-22b may vary based on the desired criteria of a particular implementation. The bases 30 are generally press fit over the predesignated sections of the first and the second bracket members 22a-22b.

Each retention peg 26 comprises a plurality of serrated ribs 32. In general, each retention peg 26 is generally configured to function like a screw thereby creating an optimal retention fit with the recesses 28 of the fans 24a and 24b. The serrated ribs 32 may prevent undesired separation between the pegs 26 and the recesses 28 of the fans 24a and 24b and may also prevent the deformation of the first and/or second bracket members 22a and 22b. In general, the serrated ribs 32 are generally formed at a predetermined durometer such that the ribs 32 compress inwardly (or deform) in response to being inserted into the recesses 28 of the fans 24a and 24b to increase retention between the first bracket member 24a and the fans. The durometer of the ribs 32 is generally arranged to allow the ribs 32 to deform within a range of 20% to 40% of the original size. In one example, the hardness of each peg 26 and each rib 32 positioned thereon is Shore A durometer of between 40-70. Such a range may allow each rib 32 to deform to facilitate sufficient retention properties with the first and the second bracket members 22a and 22b. In yet another example, the hardness of each peg 26 and rib 32 may be Shore A durometer 56. The particular hardness or durometer of the pegs and the ribs may vary based on the desired criteria of a particular implementation.

As shown, the peg 26 and the ribs 32 define a generally cylindrical cross section. In one example, the retention peg 26 and the serrated ribs 32 may define a total diameter between 5 mm and 6 mm. A portion of the retention peg 26 (e.g., portion of the peg that is independent of the serrated rib 32) may define a diameter between 3 mm and 4 mm. The diameter of the retention peg 26 together with the serrated ribs 32 and the diameter of the portion of the retention peg 26 that is independent of the serrated ribs 32 may vary based on the size of the fans. The nose of the peg 26 and the serrated ribs 32 may be tapered between six and ten degrees to facilitate insertion into the recesses 28 of the fans 24a and 24b.

The openings between each rib 32 may ensure that there may not be too much surface area of the peg 26 that is in contact with each recess 28 of the fans 24a and 24b to minimize the transmission of vibrations to the rest of the devices within the computer. Further, the openings between each rib 32 may allow for ample movement of the fans 24a and 24b with respect to the first and the second bracket members 22a and 22b to allow the isolation material to absorb vibrations caused by the movement and to prevent vibrations from being transmitted to the rest of the devices within the computer. The length for each opening may vary between 0.75 mm to 1.5 mm. In one example, the approximate length for each opening may be approximately 1 mm. The particular length for each opening between the ribs 32 may be similar or different from one another and may vary based on which particular length provides for optimal movement while minimizing the amount of vibrations that are transmitted from the assembly 20. While FIG. 4 illustrates that the ribs 32 are equally spaced from one another, it is contemplated that the ribs 32 may be spaced in a non-equal manner from one another.

In general, the retention pegs 26 may prevent the first and the second bracket members 22a-22b from buckling due the increased retention characteristic provided by the serrated ribs 32. In addition, the pegs 26 may assist in controlling the gaps G1 and G2 due to the increased retention characteristic provided by the serrated ribs 32.

Figure 5:
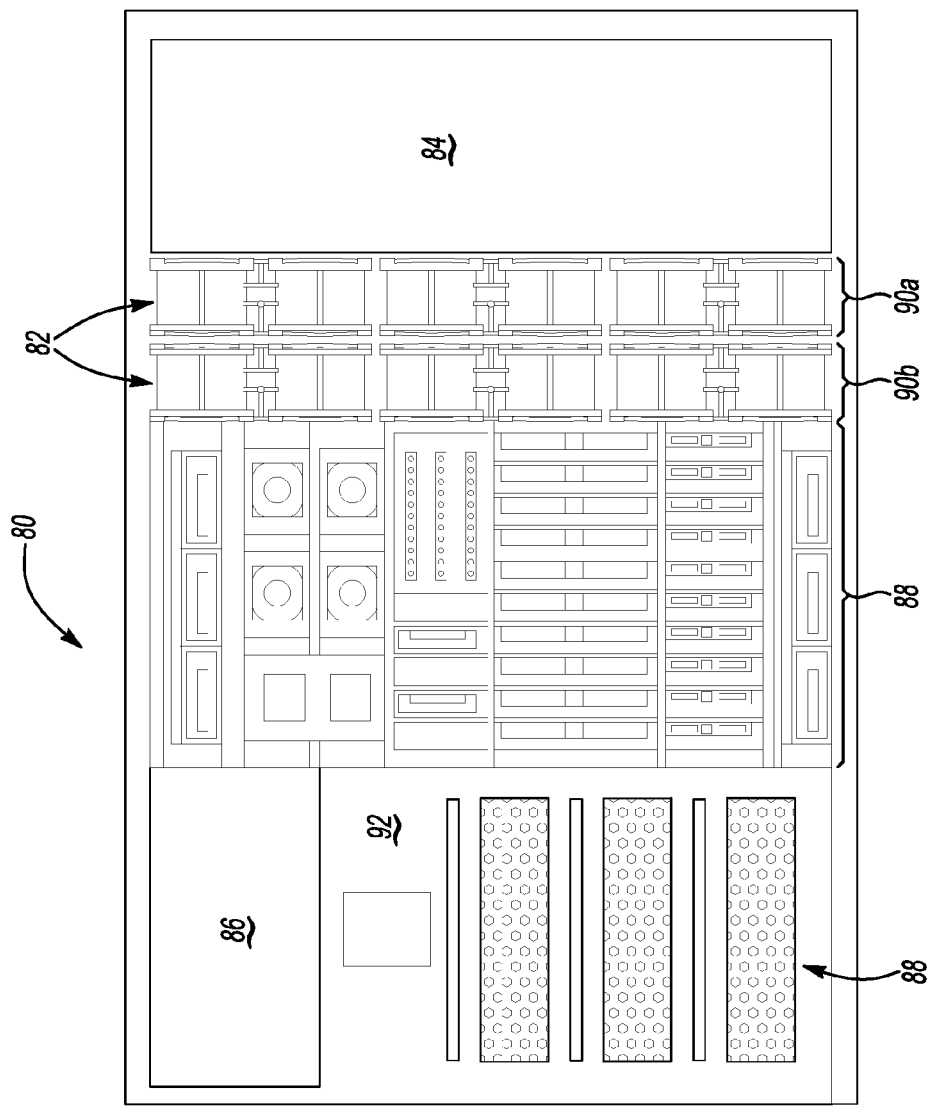
FIG. 5 depicts a computer system implementing at least one fan assembly in accordance to one embodiment of the present invention.

Referring now to FIG. 5, a computer system 80 in accordance to one embodiment of the present invention is shown. The computer system 80 includes a plurality of fan assemblies 82, a HDD 84, a power supply 86, and a plurality of electronics 88. In general, the fan assemblies 82 may be implemented to include one or more fan assemblies 20 as described above in connection with FIGS. 3-4. It is generally contemplated that any number of fans may be positioned within each fan assembly 82. The fan assemblies 82 are generally positioned within a computer chassis 92 and comprise first and second rows 90a and 90b. The first row 90a of fan assemblies 82 are configured to move heat away from the HDD 84. The second row 90b of fan assemblies 82 are configured to move heat away from the power supply 86 and the plurality of electronics 88.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A fan assembly for a computer, the assembly comprising:
   a fan housing defining at least one recess therein for directing heat away from a plurality of electrical components positioned within the computer;
   at least one bracket member for supporting the fan housing within the computer; and
   at least one retention peg disposed on the at least one bracket member, the at least one retention peg including a plurality of ribs that are radially spaced apart from one another for insertion into the at least one recess to retain the at least one bracket member to the fan housing, wherein the at least one retention peg and the plurality of ribs are constructed from a first material and the at least one bracket member is constructed from a second material, the first material being different from the second material.

2. The fan assembly of claim 1 wherein the plurality of ribs are constructed of a thermoplastic elastomer for isolating vibration.

3. The fan assembly of claim 1 the plurality of ribs are constructed with a preselected durometer to facilitate compression of the ribs by 20% to 40% upon insertion into the at least one recess.

4. The fan assembly of claim 1 wherein each rib is generally equally spaced apart.

5. The fan assembly of claim 1 wherein each rib is not equally spaced apart.

6. The fan assembly of claim 1 wherein the at least one retention peg and the plurality of ribs define a generally cylindrical cross section having a diameter between 4 mm and 6 mm.

7. The fan assembly of claim 1 wherein each rib is tapered by 6 to 10 degrees to facilitate insertion of the at least one retention peg into the at least one recess.

8. The fan assembly of claim 1 wherein each rib includes a hardness between Shore A Durometer 40 hardness and Shore A Durometer 70 hardness.

9. The fan assembly of claim 1 wherein the first material is a thermoplastic elastomer and the second material is plastic.

10. The fan assembly of claim 1 wherein each rib is spaced apart at a predetermined length to allow desired movement of the fan housing with respect to the at least one retention peg by preventing a large surface area of the plurality of ribs from contacting the at least one recess when positioned therein such that the desired movement of the fan housing causes vibrations to be absorbed by the first material of the plurality of ribs thereby preventing such vibrations from being transmitted from the fan housing to the plurality of electrical components.

11. A system for cooling a plurality of computer components, the system comprising:
    a computer chassis;
    a fan housing defining at least one recess therein for cooling the plurality of computer components;
    at least one bracket member for supporting the fan housing on the computer chassis; and
    at least one retention peg disposed on the at least one bracket member and including a plurality of ribs that are radially spaced apart from one another for insertion into the at least one recess to retain the at least one bracket member to the fan housing, wherein the at least one retention peg and the plurality of ribs are constructed from a first material and the at least one bracket member is constructed from a second material the first material being different from the second material.

12. The system of claim 11 wherein each rib within the plurality of ribs is constructed of a thermoplastic elastomer for isolating vibration.

13. The system of claim 11 wherein the plurality of ribs are constructed with a preselected durometer to facilitate compression of the ribs by 20% to 40% upon insertion into the at least one recess.

14. The system of claim 11 wherein each rib is generally equally spaced apart.

15. The system of claim 11 wherein the at least one retention peg and the plurality of ribs define a generally cylindrical cross section having a diameter between 4 mm and 6 mm.

16. The system of claim 11 wherein each rib is tapered by 6 to 10 degrees to facilitate insertion of the at least one retention peg into the at least one recess.

17. The system of claim 11 wherein each rib includes a Shore A Durometer hardness between 40 and 70.

18. The system of claim 11 wherein the first material is a thermoplastic elastomer and the second material is plastic.

19. The system of claim 11 wherein each rib is spaced apart at a predetermined length to allow desired movement of the fan housing by preventing a large surface area of the plurality of ribs from contacting the at least one recess when positioned therein such that the desired movement of the fan housing causes vibrations to be absorbed by the first material of the plurality of ribs thereby preventing such vibrations from being transmitted from the fan housing to the plurality of electrical components.

20. A fan assembly for a computer, the assembly comprising:
    a fan housing defining at least one recess therein for directing heat away from a plurality of electrical components positioned within the computer;
    at least one bracket member for supporting the fan housing within the computer; and at least one retention peg disposed on the at least one bracket member, the at least one retention peg including a plurality of ribs that are radially spaced apart from one another for insertion into the at least one recess to retain the at least one bracket member to the fan housing, wherein each rib is spaced apart at a predetermined length to allow desired movement of the fan housing by preventing a large surface area of the plurality of ribs from contacting the at least one recess when positioned therein such that the desired movement of the fan housing causes vibrations to be absorbed by an isolation material of the plurality of ribs thereby preventing such vibrations from being transmitted to the plurality of electrical components.

* * * * *